United States Patent [19]

Giles et al.

[11] Patent Number: 5,220,526

[45] Date of Patent: Jun. 15, 1993

[54] METHOD AND APPARATUS FOR INDICATING A DUPLICATION OF ENTRIES IN A CONTENT ADDRESSABLE STORAGE DEVICE

[75] Inventors: Grady L. Giles; Yui K. Ho; Robert B. Cohen, all of Austin, Tex.

[73] Assignee: Motorola, Inc., Schaumburg, Ill.

[21] Appl. No.: 662,610

[22] Filed: Mar. 1, 1991

[51] Int. Cl.$^5$ .............................................. G11C 15/00
[52] U.S. Cl. .......................................... 365/49; 365/51
[58] Field of Search ...................... 365/49, 51, 189.01, 365/189.05, 230.08

[56] References Cited

U.S. PATENT DOCUMENTS

| | | | |
|---|---|---|---|
| 4,296,475 | 10/1981 | Nederlof | 365/49 |
| 4,622,653 | 11/1986 | McElroy | 365/49 |
| 4,755,974 | 7/1988 | Yamada | 365/49 |
| 4,791,606 | 12/1988 | Threewitt | 365/49 |
| 4,965,767 | 10/1990 | Kinoshita | 365/49 |
| 5,111,427 | 5/1992 | Kobayashi | 365/49 |
| 5,130,947 | 7/1992 | Reed | 365/49 |

Primary Examiner—Eugene R. LaRoche
Assistant Examiner—A. Zarabian
Attorney, Agent, or Firm—Elizabeth A. Apperley

[57] ABSTRACT

An apparatus (10) indicates a duplication of information stored in a content addressable memory (CAM 12) system at the time the information is written to the system. In the CAM system, Match line signals (Match 0-Match (N−1) are asserted when information being written to a predetermined row is identical to information previously stored in the system. However, the Match line signal associated with the predetermined row is disabled by a predetermined transistor (14, 16, 18, 20) when the row is written. Because information is simultaneously presented in parallel to other rows in the CAM system, a Match line signal is asserted if the information currently written to the predetermined row is identical to information previously written to another row in the CAM system. Any asserted Match line signal which was not disabled indicates to the user of the CAM system that two or more entries are identical in the CAM array.

24 Claims, 3 Drawing Sheets

| Data 5 | 1 | 1 | 0 | 0 | 1 | 0 | 1 | 0 |
|---|---|---|---|---|---|---|---|---|
| Mask 5 | 0 | 0 | 0 | 0 | 0 | 0 | 0 | 0 |

Row 5

| Data 6 | 1 | 1 | 0 | 1 | 0 | 1 | 0 | 1 |
|---|---|---|---|---|---|---|---|---|
| Mask 6 | 0 | 0 | 0 | 0 | 1 | 1 | 1 | 1 |

Row 6

| Data 7 | 1 | 0 | 0 | 1 | 1 | 0 | 1 | 0 |
|---|---|---|---|---|---|---|---|---|
| Mask 7 | 0 | 0 | 0 | 0 | 0 | 1 | 0 | 1 |

Row 7

| Data 8 | 0 | 1 | 1 | 0 | 1 | 0 | 0 | 1 |
|---|---|---|---|---|---|---|---|---|
| Mask 8 | 1 | 0 | 1 | 1 | 1 | 1 | 0 | 0 |

Row 8

| Temporary Mask | 1 | 0 | 1 | 1 | 1 | 1 | 0 | 0 |
|---|---|---|---|---|---|---|---|---|

*FIG.4*

| Data 9 | 0 | 1 | 1 | 0 | 0 | 1 | 1 | 1 |
|---|---|---|---|---|---|---|---|---|
| Mask 9 | 0 | 1 | 0 | 1 | 1 | 1 | 0 | 0 |

Row 9

| Data 10 | 1 | 0 | 0 | 1 | 1 | 0 | 1 | 0 |
|---|---|---|---|---|---|---|---|---|
| Mask 10 | 1 | 0 | 0 | 0 | 0 | 0 | 0 | 0 |

Row 10

| Data 11 | 0 | 0 | 1 | 0 | 1 | 1 | 0 | 0 |
|---|---|---|---|---|---|---|---|---|
| Mask 11 | 0 | 1 | 1 | 1 | 0 | 0 | 1 | 0 |

Row 11

| Data 12 | 1 | 1 | 0 | 0 | 0 | 1 | 0 | 0 |
|---|---|---|---|---|---|---|---|---|
| Mask 12 | 0 | 1 | 1 | 1 | 0 | 0 | 0 | 0 |

Row 12

| Temporary Mask | 0 | 1 | 1 | 1 | 0 | 0 | 0 | 0 |
|---|---|---|---|---|---|---|---|---|
| External Mask | 0 | 0 | 0 | 0 | 1 | 1 | 1 | 1 |

*FIG.5*

METHOD AND APPARATUS FOR INDICATING A DUPLICATION OF ENTRIES IN A CONTENT ADDRESSABLE STORAGE DEVICE

FIELD OF THE INVENTION

This invention relates generally to data processors, and more particularly, to content addressable storage devices used by data processors.

BACKGROUND OF THE INVENTION

A content addressable memory (CAM) is a memory wherein a stored element is identified on the basis of data content rather than on storage address location. A CAM is generally formed of CAM cells arranged in rows and columns to form an array. In a traditional CAM array architecture, information is typically accessed simultaneously and in parallel to provide a data processing system which completes a large number of operations in a relatively short amount of time. The unique architecture of the CAM array has found applications in many data processing systems. For example, the parallel processing of the CAM array enables a significant amount of data from memory to be retrieved from a data processing system in less time than a conventional memory implementation. In more advanced applications, the CAM array also enables the user to expand the memory addresses of the system with no added internal memory space or added memory access time. The simple parallel operation and fast memory access times enable the CAM array to be used in a variety of applications which are not limited to accessing information from memory.

The parallel operation of the CAM array is readily implemented in a data processing system. During typical operation of the CAM array, current information loaded in the CAM array is generally referred to as the TAG word and information previously stored in the CAM array is generally referred to as a stored word. The TAG word is defined by the user of the data processing system and is compared with a plurality of stored words which have previously been stored in a CAM array. In a masked CAM array, only a portion of the bits in the stored words participate in a comparison with a similar portion of bits in the TAG word. In both cases, the TAG word and the array of stored words are simultaneously compared in parallel. If the TAG word is identical to a stored word, the CAM array provides an output signal which indicates whether or not a match occurred. Because the comparison of the TAG word with the array of stored words occurs throughout the entire array simultaneously, the memory access time of the CAM array is significantly reduced from that of a traditional memory which is used to implement the same function.

Although CAM arrays access data more quickly than other memory devices, certain characteristics detract from their performance. For example, in certain systems, if two or more matches are observed between the TAG word and the stored words in the CAM array, an incorrect output signal is provided to the data processing system. Assume that the CAM array is implemented as an address translator for providing addresses to a random access memory (RAM). If two or more matches occur during a comparison between the TAG word and the stored words in the CAM array, the CAM array provides two or more output signals to corresponding differing locations in the RAM. Therefore, if the output signals are provided to read the RAM, two or more memory locations are accessed and the resultant data on the data bus is corrupted.

Generally, two or more match signals are asserted when the TAG word matches two or more stored words in the CAM array. Some content addressable memory systems detect the occurrence of two or more match signals by using a significant amount of additional logic circuitry. After two or more match signals occur, the data processing system provides a solution to the conflict. The data processing system may implement either a prioritization routine which enables only a match signal with a highest priority level or a logic circuit which disables all asserted match signals and clears the contents of the corresponding cells in the CAM array. In either case, the added circuitry results in added memory access time as well as a significant number of added components to the data processing system.

SUMMARY OF THE INVENTION

The previously mentioned needs are fulfilled with the present invention. Accordingly, there is provided, in one form, an apparatus and method for indicating a duplication of entries in a content addressable storage device. The apparatus is comprised of a content addressable memory (CAM) which has a plurality of memory storage cells configured in rows and columns to form an array. Each row of memory cells has a first input for receiving a predetermined one of a plurality of first control signals to selectively enable each row to read or write information. Each column of memory cells has a second input for receiving a predetermined one of a plurality of second control signals to selectively write and read information respectively to or from each storage cell of the column. Furthermore, each row of memory cells provides an output signal which indicates when information which is coupled to each second input matches a portion of a row of information previously written to a predetermined row. The apparatus is also comprised of a means coupled to the content addressable memory which selectively disables the output signal of each row as each row is being written. The means permits all other output signals from rows which were not being written to remain enabled to selectively indicate a duplication of entries into more than one row of the content addressable memory. A duplication of entries into the content addressable memory is indicated when any of the other output signals enters an active state.

These and other features, and advantages, will be more clearly understood from the following detailed description taken in conjunction with the accompanying drawings.

BRIEF DESCRIPTION OF THE DRAWINGS

FIG. 4 illustrates in tabular form an example of internal masking of data stored in the content addressable storage device of FIG. 1; and FIG. 5 illustrates in tabular form an example of simultaneous external and internal masking of data stored in the content addressable storage device of FIG. 1.

DETAILED DESCRIPTION OF A PREFERRED EMBODIMENT

Figure 1:
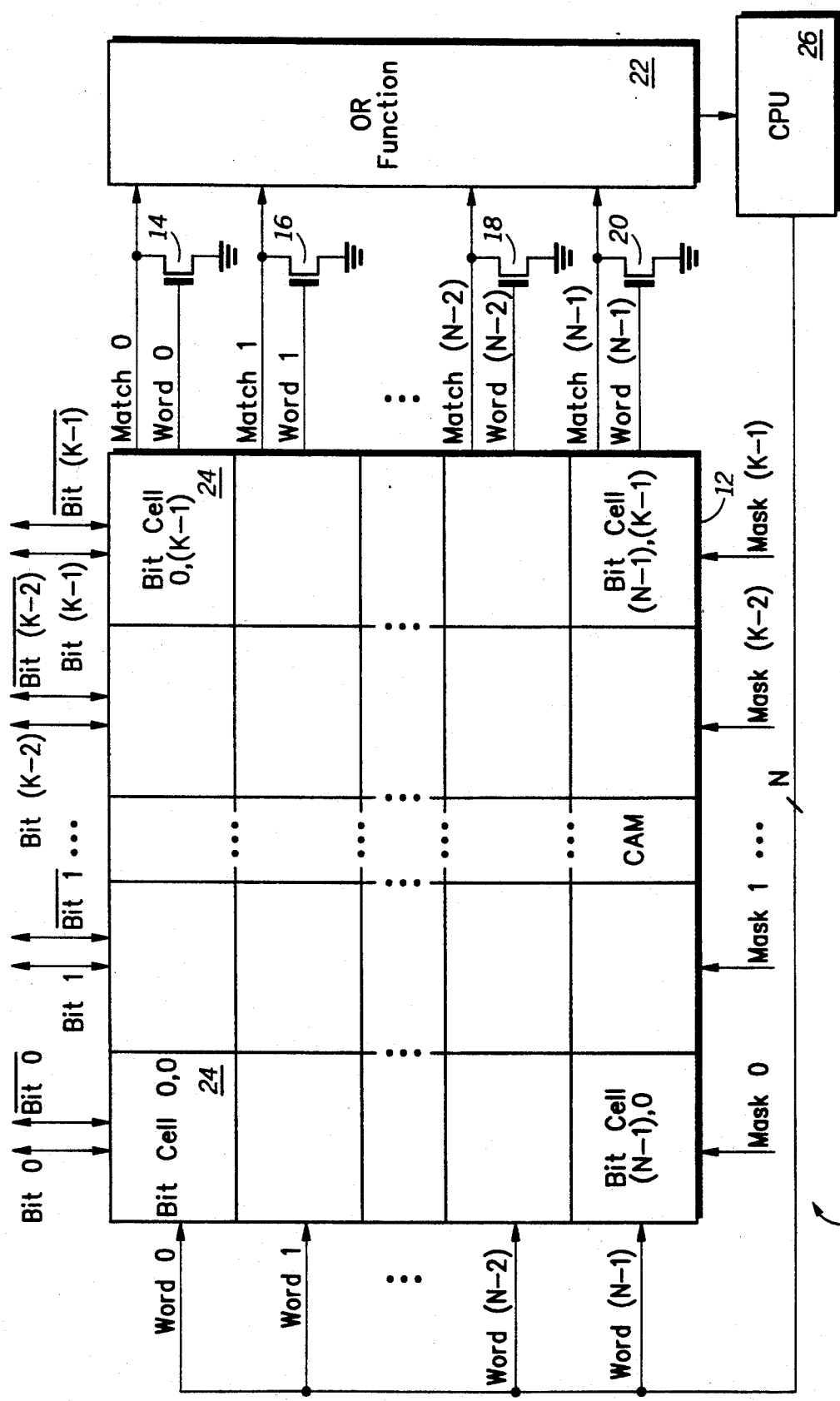
FIG. 1 illustrates in partial block diagram form a content addressable storage device in accordance with the present invention.

Illustrated in FIG. 1 is a block diagram of a content addressable storage device 10 which detects duplicate stored entries. The content addressable storage device 10 is comprised generally of a content addressable memory (CAM) array 12, a plurality of transistors 14, 16, 18, and 20, an OR function logic portion 22, and a CPU (Central Processing Unit) 26. The CPU 26 includes all control logic circuitry associated with the operation of the content addressable storage device 10.

In the content addressable storage device 10, the CAM array 12 is generally comprised of a plurality of bit cells 24 arranged in N rows and K columns, where both N and K are integers. Each of the bit cells 24 is comprised of a conventional CAM cell (not shown in detail). A word signal labelled "Word 0" provided by the CPU 26 is connected to a first input of a bit cell (0,0) and selectively enables each row to read or write information. Each word line is connected to a predetermined row of bit cells and provides a word signal. A total of N word lines is connected to the CAM array 12. A bit line labelled "Bit 0" is connected to a second input of the bit cell (0,0) and writes and reads information located at the bit cell (0,0). An inverse bit line labelled "Bit 0" is connected to a third input of the bit cell (0,0) and also writes and reads information located at the bit cell (0,0). Each bit line and inverse bit line is connected to a predetermined column of bit cells. In all, K bit lines and K inverse bit lines are connected to the CAM array 12. A mask signal labelled "Mask 0" is connected to a fourth input of bit cell (0,0). The Mask 0 signal provides mask information to be accessed during a masking operation of bit cell (0,0). The Mask 0 signal determines which bit cells 24 are allowed to participate in a comparison operation. A total of K mask signals is connected to CAM array 12 and each Mask signal is connected to a predetermined column of the CAM array 12.

Either data or address information to be loaded and stored in the CAM array 12 is typically entered by the bit lines and the inverse bit lines. When a word signal of a predetermined row of bit cells is enabled, the information is stored at that row. The CPU 26 of the data processor system 10 typically determines which word signal is enabled. Likewise, when information is read from a row of bit cells, the appropriate word signal is enabled and the information is output to the bit lines and the inverse bit lines. In a conventional write or store operation of a CAM array, information is concurrently coupled to each row of bit cells of the CAM array, but only stored in one enabled row of bit cells. In the present invention, information is stored in CAM array 12 by coupling the information via the bit lines and inverse bit lines. Each of the bit cells 24 of the CAM array 12 also performs a compare function between current information loaded to a predetermined row and information existing in the other (N−1) rows of bit cells 24 of the CAM array 12. The current information being loaded by the bit lines and the inverse bit lines is generally referred to as the TAG word and the information previously stored in all other rows of the bit cells is referred to as the stored word. If the TAG word is identical to the stored word, the CAM array 12 provides an output Match signal which indicates that a match has occurred.

The CAM array 12 provides a first plurality of N output Match signals labelled "Match 0" thru "Match (N−1)", each of which indicates that the TAG word is identical to the stored word. Each Match signal is connected to a first current electrode of one of a plurality of transistors 14, 16, 18, and 20, and to a first input of an OR function logic portion 22. CAM array 12 provides a second plurality of N output Word signals, each of which is respectively connected to a control electrode of the transistors 14, 16, 18, and 20. A second current electrode of each of the plurality of transistors 14, 16, 18, and 20 is connected to an electrical ground level. The OR function logic portion 22 is a N-input OR gate which determines if a Match signal is asserted during a current load/compare operation previously mentioned or a compare only operation. In the compare only operation, information is coupled to CAM array 12 where it is compared in each row of bit cells 24 but not stored in any bit cell row. If a Match signal is asserted during either the load/compare or compare only operation, the OR function logic portion 22 asserts an output signal labelled "Duplicate Entry Indicator". Typically, during a comparison only operation, the Duplicate Entry Indicator signal simply indicates the normal occurrence of a match between a TAG word and a stored word in the CAM array 12. However, during the load/compare operation, the Duplicate Entry Indicator signal indicates the occurrence of two or more identical entries in the CAM array 12. The Duplicate Entry Indicator signal is connected to CAM control logic (not shown) in the CPU 26.

When the TAG word is stored in a predetermined row, the Match signal of the row being written would be automatically asserted in a conventional content addressable storage device 10. In the present invention, the transistors 14, 16, 18, and 20 prevent the Match line of the row being written from being asserted. During any access of the predetermined row, only the word signal of the row being written is asserted. Because the word signal is connected to the control electrode of the transistor, the control electrode is also asserted during any access of the predetermined row. In effect, the Match line of the predetermined row being written is not asserted but is pulled to the electrical ground level by the associated transistor. If a stored word in the CAM array 12 is identical to the TAG word, the associated Match line is asserted. Any asserted Match line is connected to the OR function logic portion 22 and the Duplicate Entry Indicator signal is thereby enabled.

During a load/compare operation, the Duplicate Entry Indicator signal provides an input to the CPU 26 and indicates that two or more stored words in the CAM 12 array are identical. The Duplicate Entry Indicator signal is generally processed according to instructions specified by a user of the content addressable storage device 10. For example, upon receipt of the Duplicate Entry Indicator signal, the user may either clear one or all of the stored words in the CAM array 12 which are identical to the TAG word or enable an exception processing routine which prioritizes a plurality of asserted Match lines.

Figure 2:
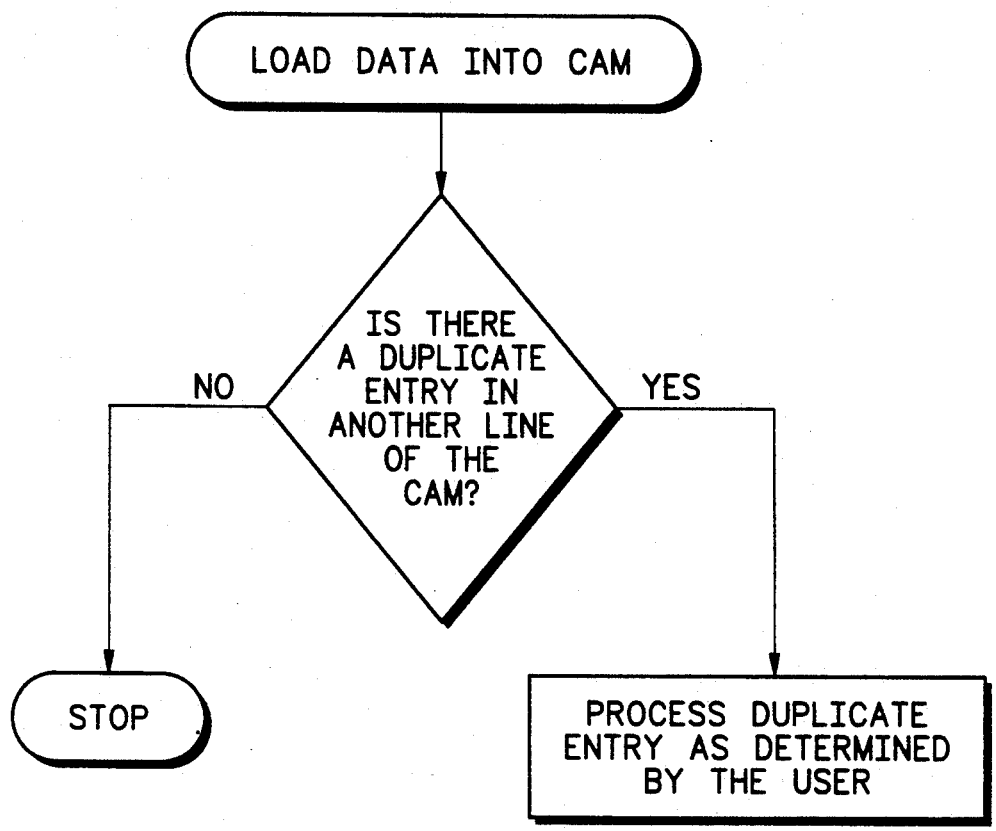
FIG. 2 illustrates in flow chart form the instruction flow implemented by the duplicate entry detection apparatus of FIG. 1.

FIG. 2 illustrates a flow chart diagram of the instruction flow implemented by the duplicate entry detection apparatus illustrated in FIG. 1. During a load/compare function requiring an access to the CAM array 12, information is loaded in the array. As each row of information is loaded, the Duplicate Entry Indicator signal is tested to determine whether or not a Match signal is asserted which did not correspond to the row being written. If the signal is not asserted, the current write or compare operation is complete and the data processing system 10 begins to process a new instruction. As mentioned above, if the duplicate Entry Indicator signal is asserted, the signal is processed in a manner determined by the user of the data processor system 10.

The duplicate entry detection apparatus described in FIG. 1 may also be implemented in masked CAM arrays. In a masked CAM array, only a portion of bits in the stored words participates in a comparison function with a similar portion of bits in the TAG word. The information provided by the mask signals defines the portion of bits used in a comparison function between the TAG word and the stored words, and is defined by the user of the system during a masking operation.

In a masked CAM array, either one or two masking operations are typically implemented. The two masking operations may be generally referred to as "external" or "internal" masking.

Figure 3:
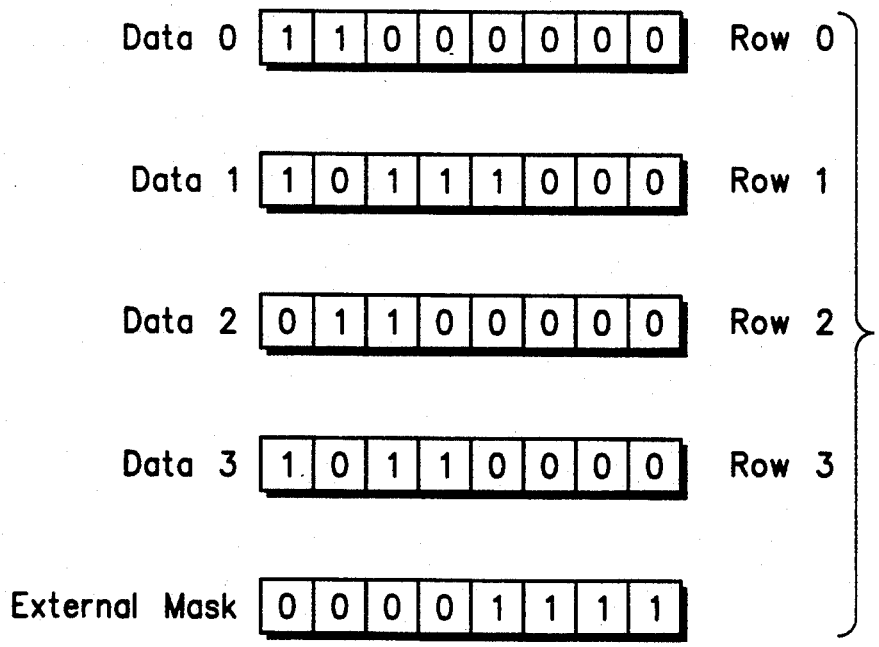
FIG. 3 illustrates in tabular form an example of external masking of data stored in the content addressable storage device of FIG. 1.

An external mask value is used only at the time of a comparison operation and prevents entire columns of the CAM array from participating in a comparison operation. Illustrated in FIG. 3 is a typical CAM array with an external mask value of that array. In the illustrated form, a data logic value is labelled for each bit cell of Row 0 through Row 3. In addition, an external mask containing a mask value for the array is provided. Assume that a mask bit value of one does not allow the corresponding bit in the TAG word to participate in the comparison function. In an example of external masking, assume that information with a hexadecimal value of $B0 is currently being stored at Row 3. The external mask has a hexadecimal value of $0F and each of the four right-most bits has a value of one. During a comparison function in an externally masked CAM array, each of the four right-most bits of all of the stored words in the CAM array does not participate in the comparison function. If the four right-most bits are masked during the comparison function, a stored word in Row 1 is identical to the TAG word loaded in Row 3. In this case, a match signal associated with Row 1 is asserted and input to the OR function logic portion 22. Consequently, the Duplicate Entry Indicator signal is asserted.

An internal mask value may also be used in the masked CAM array. Internal CAM masking associates both a data and a mask value with each bit cell and determines whether or not the data value associated with a particular bit cell may participate in the comparison operation. The data value contains the information to be compared during a comparison operation and the mask value indicates whether or not the data value is allowed to participate in the comparison operation. The portion of the data value which is allowed to participate in the comparison operation is determined prior to the execution of the operation. It should be apparent that the data value may be either data, address, or control information.

Each bit of a mask value corresponds to a single data value. A row of mask values corresponding to a row of data values in a CAM array forms a mask row value. When a row of data values is loaded in the CAM array, a corresponding internal mask row value is simultaneously broadcast and integrated with the other mask row values of previously stored rows of data values. A logic function, such as an OR function (not shown), is executed on a current mask row value and each of the previously stored mask row values to form a modified mask value for each row of data values in a CAM array.

An example of internal CAM masking is illustrated in FIG. 4. In the illustrated form, Row 5 through Row 8 of a CAM array each contain a data value and a mask value. In addition, a temporary mask stores a general mask value to be logically integrated with the mask value of each row. Assume that information and a corresponding mask value have been previously stored in Rows 5 through 7. Information with a hexadecimal value of $69 and a corresponding internal mask with a hexadecimal value of $BC are currently being loaded in Row 8. The temporary mask is typically identical to the mask row value currently loaded in the CAM array 12. Therefore, because the current mask row value has a hexadecimal value of $BC, a temporary mask is assigned a hexadecimal value of $BC. Due to the design of the CAM array 12, the information is loaded in Row 8 and is simultaneously compared with other information previously stored in the CAM array 12. The temporary mask utilizes a logic one in predetermined bit positions to effectively prevent corresponding bit positions of each row of data values from participating in the comparison operation.

If a data value of Row 6 is compared with a data value of Row 8, the mask row value associated with Row 6 is integrated with the temporary mask value. A logic circuit (not shown) integrates an internal mask row value with the temporary mask value to form a combined mask value (not shown). In this example, the mask value of Row 6 has a hexadecimal value of $0F and the mask value of Row 8 has a hexadecimal value of $BC. A combined mask value is formed as a result of the OR logic function on the two mask row values and has a hexadecimal value of $BF. Therefore, the bits in the combined mask value which have a logic one value are masked and do not participate in the comparison operation. The information stored in Row 6 then appears to be identical to the current information loaded in Row 8. Again, the duplicate entry detection apparatus taught herein suppresses the Match signal of a row being loaded during the load/compare operation. Match signals of the other rows are enabled and are asserted as a duplicate entry signal depending upon the results of the internal masking operation.

As well, both external and internal masking may be simultaneously used in a CAM array. A logic circuit (not shown) which integrates the external and internal mask values results in a second combined mask value (not shown). The logic circuitry is typically implemented as an OR function (not shown) or another similar logic function. FIG. 5 illustrates a CAM array which uses external and internal mask values simultaneously during a comparison operation. In the illustrated form, Row 9 through Row 12 of a CAM array each contain a data value and a mask value. In addition, a temporary mask stores a first general mask value to be logically integrated with the mask value of each row and an external mask stores a second general mask value. The external mask has a hexadecimal value of $0F and bits with a logic value of one are effectively disabled from participating in a comparison operation. Assume information has been previously stored in Rows 9 through 11. When information is stored in Row 12, the corresponding mask row value has a hexadecimal value of $70 and the bits with a logic value of one are prevented from participating in the comparison operation. Therefore, the temporary mask also has a hexadecimal value of $70. If a data value of Row 10 is compared with a data value of Row 12 during simultaneous external and internal masking, the mask row value associated with Row 10 is integrated with both the temporary mask value and the external mask value. A logic circuit which integrates an internal mask row value with both the temporary mask value and the external mask value to form a combined mask value is typically implemented as an OR function (not shown) or another similar logic function. In this example, the mask value of Row 10 has a hexadecimal value of $80, the temporary mask has a hexadecimal value of $70, and the external mask has a hexadecimal value of $0F. The combined mask value has a hexadecimal value of $FF. Therefore, bits with a logic value of one (i.e. all but the left-most bit) are masked and do not participate in the comparison operation. Subsequently, the information in Row 10 appears to be identical to the information in Row 12 and a match signal is asserted. The match signal is input to the OR function logic portion 22 and the Duplicate Entry Indicator signal is output to the CPU 26.

It should be well understood that an apparatus to detect the duplication of entries in a content addressable storage device enhances the efficient operation of a data processing system. The need to provide a quick and inexpensive solution for duplicate entries within a content addressable memory system is a concern of many systems designers. Current content addressable memory systems detect the occurrence of two or more match signals between the TAG word and the stored words in the CAM array with a significant amount of additional logic circuitry. The data processing system typically either implements a prioritization routine which enables only one match signal with the highest priority level or a logic circuit which disables all signals and clears the contents of the CAM array 12. In either case, the added circuitry results in added memory access time as well as a large number of added components to the data processing system.

The content addressable memory storage apparatus described herein provides an effective and unique solution to detect the duplicate entry of TAG words in a CAM array 12. The invention implements a unique method for detecting duplicate entries through the addition of a single transistor on the output of the Match signal of each row in the CAM array 12. The transistor effectively disables the Match signal associated with the row being written during the load operation. However, the Match signals of other rows which are not written are still enabled. Therefore, if another stored word in the CAM 12 array is identical to the word being stored, the Match signal associated with the stored word is asserted and the Duplicate Entry Indicator signal is consequently asserted. By enabling the Duplicate Entry Indicator signal during the load operation with the addition of a single transistor on the output of the word signal of each row in the CAM array, both memory access time and component count are reduced. In other CAM systems, the prioritization routines and the logic circuits which are used to indicate a duplicate entry into the CAM array occur at the comparison operation access time and, therefore, result in both slower memory access times and higher component counts.

By now it should be apparent that there has been provided an apparatus for indicating a duplication of entries in a content addressable storage device. There are many additional configurations for implementing the invention described above. The transistor used to disable the Match signal of the row being written during the load operation could be replaced with another component or software implementation which provided the same function. If a transistor is used to disable the Match signal of the row being written, the transistor could be fabricated using bipolar, MOS or another similar semiconductor technology. Additionally, the bit cell 24 could be implemented using any standard CAM cell configuration. For example, a bit cell which uses only a single bit line and not an inverse bit line to provide data could be easily integrated in the CAM array. As well, although masking certain portions of stored words in the CAM array is useful to the user of the system at certain times, it is an additional feature of the present invention described herein. Logic values associated with the masking taught herein are provided by way of example only and may be readily modified. In some cases, different data paths for loading and reading the CAM array might be used. As well, the OR function logic portion 22 could be implemented in a different or more complex manner to fully satisfy the needs of the user's system and still provide the Duplicate Entry Indicator signal.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A content addressable storage device comprising:
    a control means for controlling accessing of the storage device; and
    a content addressable memory (CAM) array comprising:
        a plurality of CAM bit cells arranged in an array of N rows and K columns, where K and N are integers;
        N row select lines, each of said N row select lines coupled to K of said CAM bit cells;
        K bit lines, each of said K bit lines coupled to N of said CAM bit cells;
        N match signals, each of said N match signals coupled to K of said CAM bit cells;
        N match signal disable transistors, each of said match signal disable transistors has a first current electrode coupled to one of said N match signals, a second current electrode coupled to a voltage supply terminal and a gate electrode coupled to one of said N row select lines to allow said match signal to be coupled to said voltage supply source when said row select line is active; and
        an OR logic function having N inputs and one output, each of said N inputs coupled to one of said N match signals and said one output is coupled to said control means.

2. The content addressable storage device of claim 1 wherein each of the N match signals indicates when information which is coupled to each of the K bit lines matches only a portion of a row of information previously written to a predetermined row, the portion being determined by a plurality of mask bits respectively coupled to predetermined CAM bit cells by mask line inputs.

3. In a content addressable storage device, an apparatus for indicating a duplication of stored data values, comprising:

a content addressable memory (CAM) having a plurality of memory storage cells configured in a plurality of rows and a plurality of columns each of the plurality of rows of memory storage cells having a first input for receiving a predetermined one of a plurality of first control signals to selectively enable each of the plurality of rows to either read a stored data value or write a new data value, each of the plurality of columns of memory storage cells having a second input for receiving a predetermined one of a plurality of second control signals to selectively write a bit of the new data value or read a bit of the stored data value respectively to or from each of the plurality of columns, and each of the plurality of rows of memory storage cells providing a match output signal indicating when the new data value which is coupled to the second input of each of the plurality of columns of memory storage cells matches a portion of the stored data value in one or more of the plurality of rows of memory storage cells; and disabling means coupled to the content addressable memory for selectively disabling the match output signal of a selected row of memory storage cells as the new data value is being written to the selected row, said disabling means permitting the match output signal corresponding to each of the plurality of rows of memory storage cells not being written to remain enabled to selectively indicate a duplication of the new data value in another row of memory storage cells when the match output signal corresponding to one of the plurality of rows of memory storage cells not being written is asserted.

4. The apparatus of claim 3 wherein said disabling means selectively disables the match output signal corresponding to one of the plurality of rows of memory storage cells not being written by using the plurality of first control signals to inhibit only the match output signal of the selected row of memory storage cells when the new data value is being written therein.

5. The apparatus of claim 3 wherein said disabling means for selectively disabling the match output signal further comprises:

a plurality of transistors, each transistor being coupled to the predetermined match output signal and having a control electrode connected to a predetermined one of the plurality of first control signals, for selectively coupling the predetermined match output signal to a reference voltage terminal.

6. The apparatus of claim 3 further comprising:

logic means for logically combining a plurality of match output signals to indicate if the new data value written to the selected row of memory storage cells is currently stored in another one of the plurality of rows of memory storage cells in the array.

7. The apparatus of claim 3 wherein the match output signal is provided by one of the plurality of rows of memory storage cells only when the new data value coupled to the second input of each of a corresponding plurality of columns of memory storage cells exactly matches the stored data value in the one of the plurality of rows of memory storage cells.

8. The apparatus of claim 3 wherein the match output signal is provided by one of the plurality of rows of memory storage cells only when the new data value coupled to the second input of each of a corresponding plurality of columns of memory storage cells does not exactly match the stored data value in the one of the plurality of rows of memory storage cells.

9. The apparatus of claim 3 wherein the portion of the stored data value which is compared to the new data value is determined using a plurality of mask values, each of the plurality of mask values corresponding to one of the plurality of rows of memory storage cells, each of the plurality of mask values masking a first portion of the stored data value in a corresponding one of the plurality of rows of the memory storage cells, a second portion of the stored data value determining a portion of the plurality of memory storage cells comprising each of the plurality of rows which must be equal to a corresponding bit of the new data value before providing the match output signal.

10. The apparatus of claim 9 wherein each of the plurality of mask values is stored in a mask register associated with a predetermined row of memory storage cells.

11. A method for indicating a duplication of entries in a content addressable memory, comprising the steps of:

configuring a plurality of memory storage cells in a plurality of rows and a plurality of columns to form a content addressable memory array, each of the plurality of rows of memory storage cells having a first input and each of the plurality of columns of memory storage cells having a second input;

providing a predetermined one of a plurality of first control signals to the first input of each of the plurality of rows of memory storage cells to selectively enable each of the plurality of rows of memory storage cells to either read a stored data value or write a new data value;

providing a predetermined one of a plurality of second control signals to the second input of each of a plurality of columns of memory storage cells to selectively write a bit of the new data value or read a bit of the stored data value respectively to or from each of the plurality of columns;

enabling each of the plurality of rows of memory storage cells to provide a match output signal, the match output signal indicating when the new data value which is coupled to the second input matches a portion of the stored data value in one or more of the plurality of rows of memory storage cells;

selectively disabling the match output signal corresponding to a selected row of memory storage cells as the new data value is being written to the selected row; and permitting a remaining portion of the match output signals corresponding to the plurality of rows of memory storage cells not being written to remain enabled to selectively indicate a duplication of the stored data value in the selected row in at least one other row of the plurality of rows of memory storage cells in the content addressable memory when any of the remaining portion of the match output signals is asserted.

12. The method of claim 11 wherein the step of selectively disabling further comprises:

using the plurality of first control signals to disable only the match output signal of the selected row when a new data value is being written therein.

13. The method of claim 11 wherein the portion of the stored data value which is compared to the new data value is determined using a plurality of mask values, each of the plurality of mask values corresponding to one of the plurality of rows of memory storage cells, each of the plurality of mask values masking a first portion of the stored data value in a corresponding one of the plurality of rows of the memory storage cells, a second portion of the stored data value determining a portion of the plurality of memory storage cells comprising each of the plurality of rows which must be equal to a corresponding bit of the new data value before providing the match output signal.

14. The method of claim 11 wherein the step of selectively disabling further comprises the step of:

disabling the match output signal of each of the plurality of rows of the content addressable memory by using one transistor per row, each transistor being coupled to a predetermined match output signal and having a control electrode connected to a predetermined first control signal, each transistor selectively coupling the predetermined match output signal to a reference voltage terminal.

15. The method of claim 14 wherein the portion of the stored data value which is compared to the new data value is determined by using one of a plurality of mask values, each one of the plurality of mask values corresponding to one of the plurality of rows of memory storage cells, each of the plurality of mask values masking a first portion of the stored data value in each of the plurality of rows of the memory storage cells, a second portion of the stored data value determining a portion of the plurality of memory storage cells comprising each of the plurality of rows which must be equal to a corresponding bit of the new data value before providing the match output signal.

16. A content addressable storage device, comprising:
  a control means for controlling accessing of the storage device; and
  a content addressable memory (CAM) array comprising:
    a plurality of CAM bit cells arranged in an array having a plurality of rows and a plurality of columns;
    a plurality of row select lines, each of the plurality of row select lines coupled to an input of one of the plurality of rows of CAM bit cells;
    a plurality of bit lines, each of the plurality of bit lines coupled to one of the plurality of columns of CAM bit cells;
    a plurality of match lines, each of the plurality of match lines coupled to an output of one of the plurality of rows of CAM bit cells;
    a match signal disable circuit comprising a plurality of logic circuits, each of the plurality of logic circuits further comprising:
      i) a first terminal coupled to one of the plurality of match lines;
      ii) a second terminal coupled to one of the plurality row select lines; and
      iii) a third terminal coupled to a reference voltage;
    each of the plurality of logic circuits coupling the reference voltage to the first terminal when the one of the plurality of row select lines coupled to the second terminal is active; and
    a logic circuit coupled to the match signal disable circuit for receiving each of the plurality of match lines, the logic circuit providing an output which is coupled to the control means.

17. The content addressable storage device of claim 16 wherein a data value is written to a first one of the plurality of rows of CAM bits cells when a first one of the plurality of row select lines is active.

18. The content addressable storage device of claim 17 wherein the output of the logic circuit indicates a duplication of the data value being written to the first one of the plurality of rows of CAM bit cells in at least one other of the plurality of rows of CAM bit cells.

19. The content addressable storage device of claim 16 wherein the control means performs an exception processing routine in response to the output of the logic circuit.

20. The content addressable storage device of claim 19 wherein the exception processing routine enables the control means to clear a data value stored in at least one of the plurality of rows of CAM bit cells.

21. The content addressable storage device of claim 19 wherein the output of the logic circuit indicates a duplication of a data value being written to a first one of the plurality of rows of CAM bit cells in at least one other one of the plurality of rows of CAM bit cells.

22. The content addressable storage device of claim 16 wherein the logic circuit is an OR function.

23. The content addressable storage device of claim 16 wherein each of the plurality of logic circuits comprising the match signal disable circuit is a transistor.

24. The content addressable storage device of claim 23 wherein the first terminal is a first current electrode of the transistor, the second terminal is a gate electrode of the transistor, and the third terminal is a second current electrode of the transistor.

* * * * *